United States Patent
Ou

(10) Patent No.: US 8,429,334 B2
(45) Date of Patent: Apr. 23, 2013

(54) METHOD FOR PREVENTING DATA LOSS DURING SOLDER REFLOW PROCESS AND MEMORY DEVICE USING THE SAME

(75) Inventor: Hsu-Ping Ou, Jhubei (TW)

(73) Assignee: Silicon Motion, Inc., Jhubei (TW)

( * ) Notice: Subject to any disclaimer, the term of this patent is extended or adjusted under 35 U.S.C. 154(b) by 1074 days.

(21) Appl. No.: 12/404,332

(22) Filed: Mar. 15, 2009

(65) Prior Publication Data

US 2010/0169547 A1   Jul. 1, 2010

(30) Foreign Application Priority Data

Dec. 25, 2008   (TW) .............................. 97150598 A

(51) Int. Cl.
 *G06F 12/00* (2006.01)
(52) U.S. Cl.
 USPC ..... 711/103; 711/165; 711/154; 711/E12.103
(58) Field of Classification Search .................. None
 See application file for complete search history.

(56) References Cited

U.S. PATENT DOCUMENTS

| 2008/0059703 A1* | 3/2008 | Yoshioka et al. ............. 711/115 |
| 2009/0175075 A1* | 7/2009 | Yeh et al. .................. 365/185.03 |
| 2010/0042772 A1* | 2/2010 | Bonella et al. ................ 711/103 |

* cited by examiner

*Primary Examiner* — Reginald Bragdon
*Assistant Examiner* — Arvind Talukdar
(74) *Attorney, Agent, or Firm* — Wang Law Firm, Inc.; Li K. Wang; Stephen Hsu

(57) ABSTRACT

The invention provides a method for preventing data loss in a flash memory during a solder reflow process. The flash memory includes a plurality of memory blocks and each memory block includes a plurality of strong pages and weak pages. Preloading data is first received and stored into the strong pages of at least one of first memory block within the flash memory. Then, the flash memory is heated for the solder reflow process. Next, the preloading data is reorganized according to a trigger signal and the strong pages and weak pages of at least one of second memory block within the flash memory are provided for storing the reorganized preloading data.

20 Claims, 5 Drawing Sheets

PAGE 0(S0) | PAGE 1(S1) | PAGE 2(S2) | PAGE 3(S3) | PAGE 4(W0) | PAGE 5(W1) | PAGE 6(S4) | PAGE 7(S5) | PAGE 8(W2) | PAGE 9(W3) | PAGE 10(S6) | PAGE 11(S7) | PAGE 12(W4) | PAGE 13(W5) | . . .

METHOD FOR PREVENTING DATA LOSS DURING SOLDER REFLOW PROCESS AND MEMORY DEVICE USING THE SAME

CROSS REFERENCE TO RELATED APPLICATIONS

This application claims priority of Taiwan Patent Application No. 097150598, filed on Dec. 25, 2008, the entirety of which is incorporated by reference herein.

BACKGROUND OF THE INVENTION

1. Field of the Invention

The invention relates to flash memory, and more particularly to a data storing method for multi-level cell (MLC) flash memory.

2. Description of the Related Art

Non-volatile memory, e.g., NAND flash memory, which has the advantages of a speedy programming time, a small chip area and low power consumption, commonly serve as storage media for various kinds of multimedia data, e.g., secure digital (SD) cards or compact flash (CF) cards. In general, a NAND flash memory may comprise a single-level cell (SLC) flash memory and a multi-level cell (MLC) flash memory, wherein each single-level cell may store two values '0' and '1' and each multi-level cell may store more than four values, e.g., '00', '01', '10' and '11', thus allowing for higher storage density.

However, compared with the single-level cell flash memory, the multi-level cell flash memory disadvantageously is subject to data corruption and data loss. Specifically, during the process of soldering memory components to printed circuit boards, data pre-stored in a multi-level cell flash memory may undergo data loss due to high temperature heating for solder reflowing, thus causing memory malfunctions or requirement to re-write the pre-stored data. As a result, the aforementioned problems may significantly reduce mass production efficiency and increases costs.

Therefore, it is desirable to provide a method capable of solving the problem due to data loss induced by the multi-level cell flash memory during a solder reflow process and further improving the efficiency of mass producing multi-level cell flash memories.

BRIEF SUMMARY OF THE INVENTION

The invention provides a method for preventing data loss in a flash memory during a solder reflow process. In an embodiment, the flash memory comprises a plurality of memory blocks, each of which having a plurality of strong pages and a plurality of weak pages. Preloading data is first received and stored into the strong pages of at least one of first memory block within the flash memory. Then, the flash memory is heated for the solder process. Next, the preloading data is reorganized according to a trigger signal and the strong pages and weak pages of at least one of second memory block within the flash memory are provided for storing the reorganized preloading data.

In addition, the invention further provides a memory device. In an embodiment, the flash memory device comprises a flash memory and a controller. The flash memory comprises a plurality of memory blocks for storing data, each having a plurality of strong pages and a plurality of weak pages. The controller is coupled to the flash memory for receiving a preloading data and storing the preloading data into the strong pages of at least one first memory within the flash memory. Upon a solder reflow process heating the flash memory, the controller reorganizes the preloading data according to a trigger signal and sequentially stores the reorganized preloading data into the strong pages and the weak pages of at least one second memory block within the flash memory.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIG. 3 is a block diagram of a memory block according to an embodiment of the invention;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
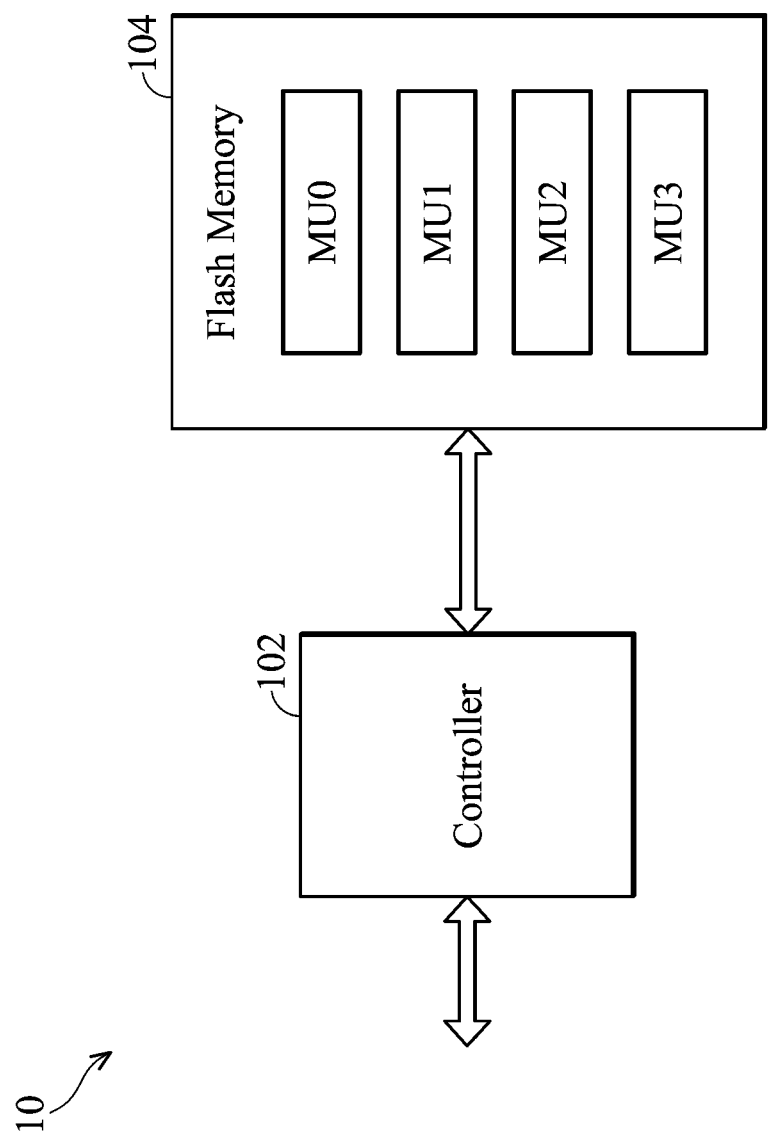
FIG. 1 is a block diagram of a memory device according to an embodiment of the invention.

FIG. 1 is a block diagram of a memory device 10 according to an embodiment of the invention. The memory device 10 comprises a flash memory 104 and a controller 102.

In an embodiment, the memory device 10 is a memory card or a solid state disk (SSD). The flash memory 104 is a NAND flash memory. The memory device 10 transmits and receives data to an external host (not shown in FIG. 1), e.g., a digital camera or a cell phone, via different interfaces, such as a universal serial bus (USB), a personal computer memory card international association (PCMCIA), or a serial advanced technology attachment (SATA).

During operation, the controller 102 is coupled between the flash memory 104 and the external host. The controller 102 receives a control signal, a logic address and data from the external host so as to store the data into the flash memory 104 according the control signal and the logic address. Moreover, the flash memory 104 comprises a plurality of management units, e.g., MU0 to MU3 shown in FIG. 1 and each management unit is used for managing a predetermined number of memory blocks. That is, the controller 102 accesses the data corresponding to the memory blocks and stored thereof via the management units MU0~MU3.

Figure 2:
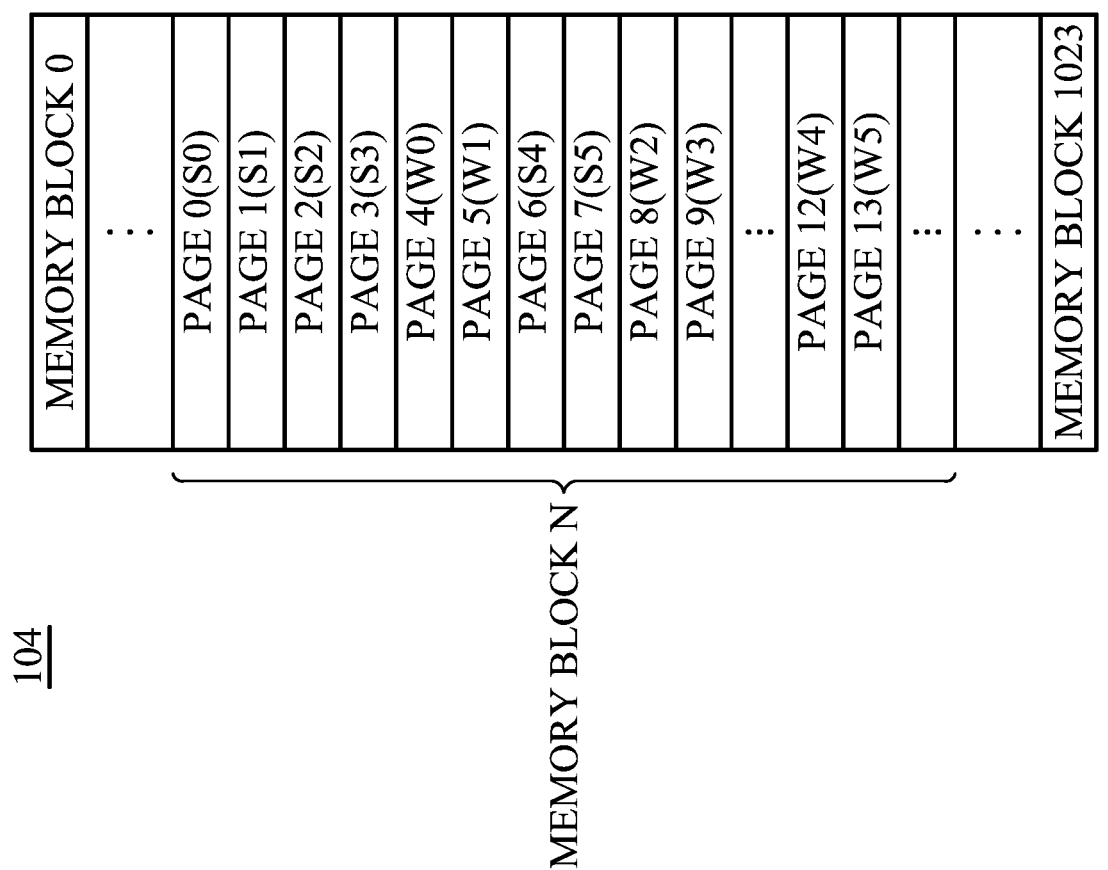
FIG. 2 is a block diagram of a flash memory according to an embodiment of the invention.

FIG. 2 is a block diagram of a flash memory 104 according to an embodiment of the invention. As shown in FIG. 2, the flash memory 104 comprises several multi-level cell memory blocks, e.g., MEMORY BLOCK 0, . . . MEMORY BLOCK N, . . . MEMORY BLOCK 1023, which are respectively managed by the management units MU0~MU3. In the embodiment, each memory block, such as MEMORY BLOCK N, comprises a plurality of pages. It is noted that the pages includes a plurality of strong pages and a plurality of weak pages.

Referring to FIG. 2, the strong pages and the weak pages are alternately arranged on the basis of a predetermined order. For example, in the MEMORY BLOCK N, PAGE 0 (represented by S0) to PAGE 3 (represented by S3) are strong pages, PAGE 4 (represented by W0) and PAGE 5 (represented by W1) are weak pages, PAGE 6 (represented by S4) and PAGE 7 (represented by S5) are strong pages, PAGE 8 (represented by W2) and PAGE 9 (represented by W3) are weak pages, ... PAGE 12 (represented by W4) and PAGE 13 (represented by W5) are weak pages, and so on.

In general, compared to a weak page, for writing data, a strong page requires less programming busy time, and the reliability of data stored in the strong page may not be easily affected by environment factors, such as temperature and humidity. During mass production of memory cards, the high temperature of the solder reflow process performed on the flash memory 104, e.g., heating via an infrared emitter or roasting by an oven, may result in data loss or corruption of the preloading data pre-stored within the weak page, e.g., system files or testing materials. Additionally, the problem may cause malfunction of memory cards and re-writing of preloading data. Consequently, cost for re-writing is accordingly increased and efficiency of mass production is significantly reduced. Thus, in order to prevent data loss stored in weak pages due to the high temperature environment, the embodiments of the invention provide a method to store data into the strong pages before a solder reflow process is performed. A detailed description is given below with reference to FIGS. 3 and 4.

FIG. 3 is a block diagram of a memory block 30 according to an embodiment of the invention. In an embodiment, the memory block 30 is any memory block within the flash memory 104, e.g., MEMORY BLOCK N. As shown in FIG. 3, the memory block 30 is configured to operate in a strong page only state. That is, when data is written into the memory block 30, the data is only permitted to be written into strong pages, e.g., PAGE 0~3, PAGE 6~7, PAGE 10~11, and so on. In this case, the storage size of the memory block 30 is smaller than that of the memory block not configured (for example, MEMORY BLOCK N in FIG. 2). According to an embodiment, when the strong pages and the weak pages are alternately arranged on the basis of a predetermined order, the memory block 30 has half the storage size with respect to that of the MEMORY BLOCK N.

More specifically, when the preloading data is written into the flash memory 104, entire or partial management units of the flash memory 104 are configured to operate in the strong page only state. According to an embodiment, the controller 102 selects the management units to be configured according to the size of the preloading data. Then, the flash memory 104 performs a low-level format. Next, the controller 102 stores the preloading data into the configured management units. Therefore, the entire preloading data is sequentially written into the strong pages of corresponding memory blocks, e.g., PAGE 0~3, PAGE 6~7, and PAGE 10~11 as shown in FIG. 3. Then, heating or roasting of the controller 102 and the flash memory 104 is performed for the solder reflow process. In an embodiment, the solder reflow process may be performed by using an infrared reflow, a vapor phase reflow or a heating furnace process.

After the controller 102 and the flash memory 104 are soldered into a printed circuit board, the controller 102 then reorganizes the preloading data according to a trigger signal. The reorganization operation of the preloading data is described below in detail.

Figure 4:
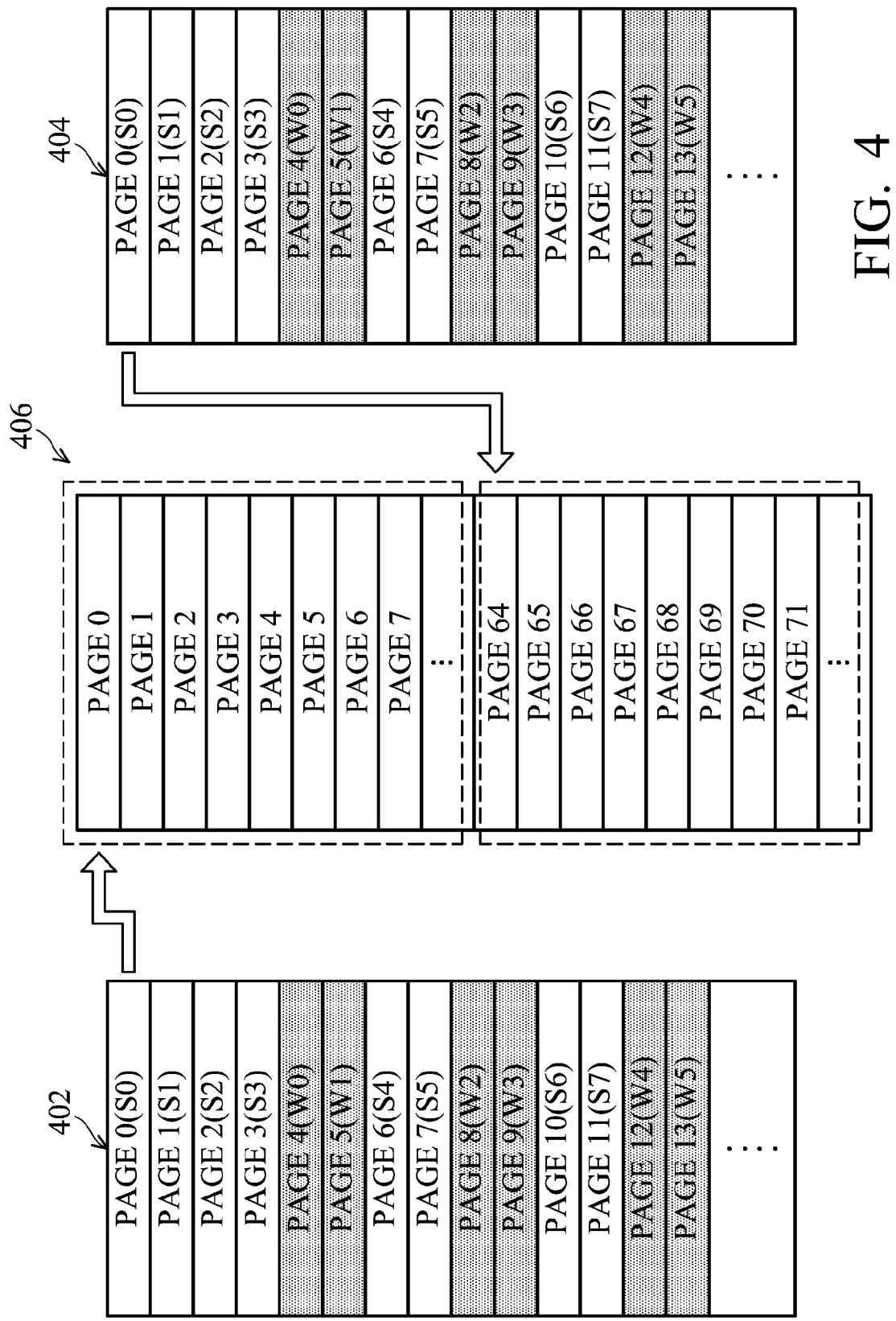
FIG. 4 is a block diagram of preloading data reorganization according to an embodiment of the invention.

FIG. 4 is a block diagram of preloading data reorganization according to an embodiment of the invention. According to this embodiment, it is assumed that preloading data is stored in the memory blocks 402 and 404 of the management unit MU0 prior to performing a solder reflow process. Note that the memory blocks 402 and 404 are configured to operate in a strong page only state.

After completion of the solder reflow process, the controller 102 in FIG. 1 performs the reorganization of the preloading data stored in the strong pages of memory blocks 402 and 404. In accordance with an embodiment, the controller 102 performs the preloading data reorganization according to a trigger signal, wherein the trigger signal may be generated by a software or firmware method according to a recovery command from an external testing host. In accordance with another embodiment, the controller 102 may also use a hardware method, e.g., a preset pin in the flash memory 104. Next, the controller 102 determines whether a solder reflow process is completed according to the state of the preset pin, and accordingly generates the trigger signal for performing the preloading data reorganization.

As shown in FIG. 4, among the management units that are not configured to operate in a strong page only state, the controller 102 chooses a memory block for storing the reorganized preloading data, e.g., memory block 406 within the management unit MU1. In other words, the reorganized preloading data is sequentially written into both the strong pages and the weak pages within the memory block 406.

For example, it is assumed that the memory block 406 and the memory blocks 402 and 404 that are not configured to operate in a strong page only state respectively comprises 128 pages, wherein the pages comprises a plurality of strong pages and a plurality of weak pages alternately arranged on the basis of a predetermined order. That is, the configured memory blocks 402 and 404 have half the storage size with respect to the memory block 406.

During reorganization, the preloading data stored in the strong pages (for example, PAGE 0~3, PAGE 6~7, PAGE 10~11, etc) of the memory block 402 may be reorganized and sequentially stored into PAGE 0~63 within the memory block 406. Similarly, the preloading data stored in the strong pages of the memory block 404 may be sequentially stored in PAGE 64~127 within the memory block 406.

It is noted that at the reorganization of the preloading data may be performed in the background during the solder reflow process, such that the memory device may also concurrently perform other functional tests.

Furthermore, upon preloading data reorganization, the controller 102 performs an erase operation on all memory blocks of the management MU0 corresponding to the memory blocks 402 and 404. Therefore, in the erased management unit MU0, the storage size of all memory blocks may be reset. That is, memory blocks 402, 404, and 406 have the same storage size.

In an embodiment, the controller 102 may further determine whether the preloading data stored in the memory block 406 is correct. When the stored preloading data is not correct, the external testing host can record the determination via the controller 102, or directly mark the memory device with a preloading failure mark.

Figure 5:
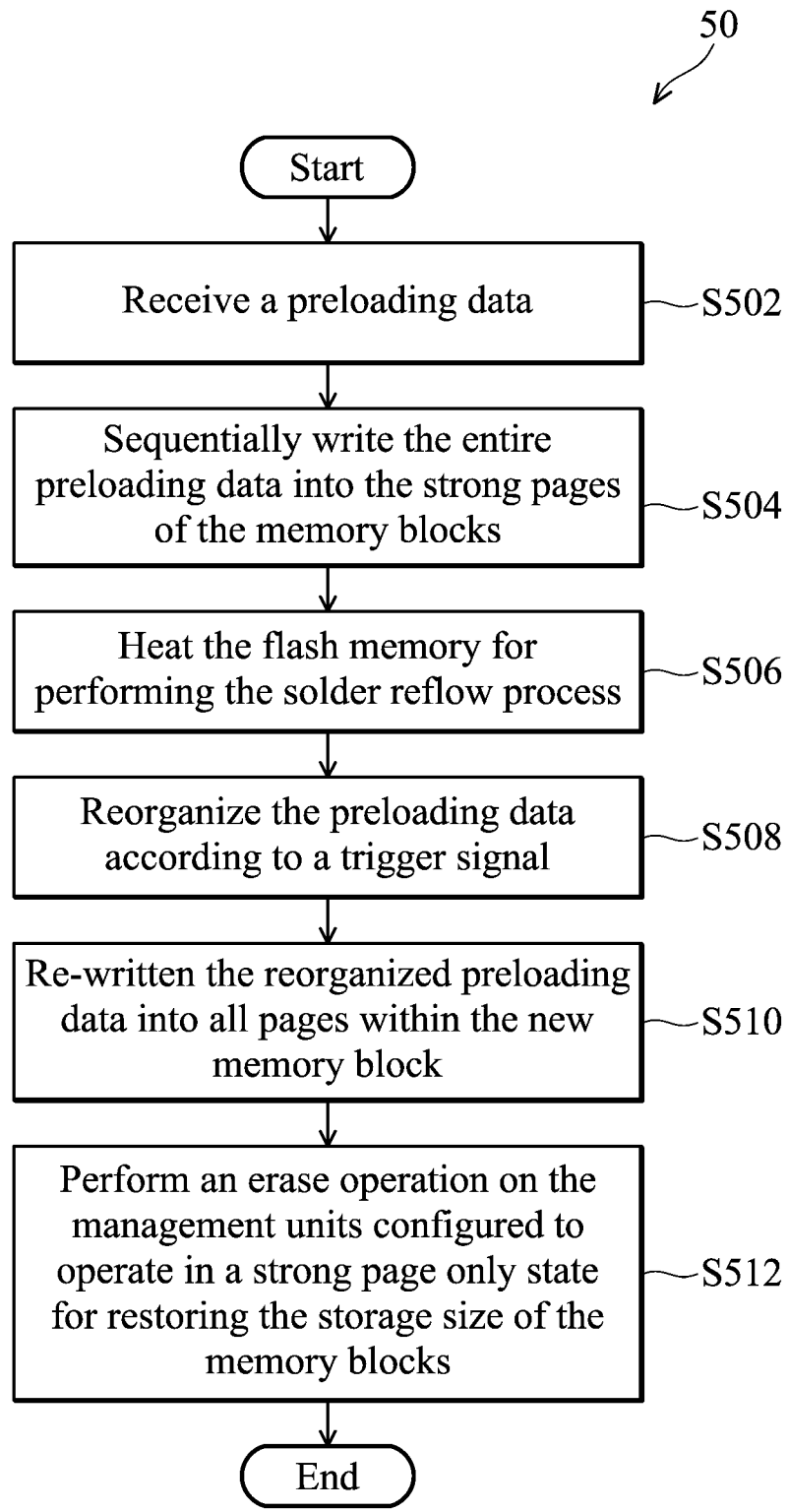
FIG. 5 is a flowchart showing a method for preventing data loss during a solder process according to an embodiment of the invention.

FIG. 5 is a flowchart for preventing data loss during a solder reflow process according to an embodiment of the invention. As above-described, the method is used for a flash memory. In an embodiment, the flash memory is a NAND flash memory, wherein the flash memory comprises a plurality of management units each having a predetermined number of multi-level memory blocks for accessing the corresponding memory blocks via each management unit. Moreover, each memory block comprises a plurality of strong pages and a plurality of weak pages, which are alternately arranged on the basis of a predetermined order. During operation of storing data, the programming busy time of each strong page is less than that of each weak page.

First, a preloading data is loaded or received (step S502). During operation, one or more management units within the flash memory are selected. According to the selected management units, the corresponding memory blocks are configured to operate in a strong page only state for storing the preloading data. From the aforementioned embodiments, in each memory block, when the strong pages and the weak pages are alternately arranged on the basis of a predetermined order, the configured memory block has half the storage size with respect to that of the memory block not being configured.

In addition, the flash memory 104 performs a low-level format and sequentially stores the entire preloading data into the strong pages of the memory blocks (step S504).

Then, the flash memory is heated for performing the solder reflow process (step S506).

Next, the preloading data is reorganized according to a trigger signal (step S508). More specifically, according to the required storage size of the preloading data, from the management units that are configured to operate in a strong page only state, a new memory block is selected for storing of the reorganized preloading data. As such, the reorganized preloading data can be re-written into all pages within the new memory block (step S510).

It is noted that the trigger signal may be generated by a software method, such as a recovery command, or by a hardware method, e.g., a state of a preset pin of the flash memory.

Moreover, upon the reorganization of preloading data, an erase operation is performed on the management units configured to operate in a strong page only state for restoring the storage size of the memory blocks (step S512). In addition, the integrity of the reorganized preloading data is further determined.

The invention discloses a method for preventing data loss during a solder reflow process and memory device using the same, further solving the problems of data loss or corruption of preloading data in weak pages due to high temperatures. In addition, the controller of the memory device reorganizes the preloading data and stores the reorganized preloading data into strong pages and weak pages within memory blocks. Thus, the invention is provided to improve the efficiency of mass production without memory size loss, and ensure the integrity and reliability of the preloading data.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A method for preventing data loss in a flash memory during a solder reflow process, wherein the flash memory comprises a plurality of memory blocks, each of which having a plurality of strong pages and a plurality of weak pages, and the strong pages have a higher data reliability than that of the weak pages, comprising:
   receiving a preloading data;
   storing the preloading data into the strong pages of at least one first memory block within the flash memory before the flash memory is heated in the solder reflow process;
   heating the flash memory for performing the solder reflow process; and
   reorganizing the preloading data according to a trigger signal and then sequentially storing the reorganized preloading data into the strong pages and the weak pages of at least one second memory block within the flash memory.

2. The method according to claim 1, wherein the trigger signal is generated according to a recovery command.

3. The method according to claim 1, wherein the trigger signal is generated according to a state of a preset pin of the flash memory.

4. The method according to claim 1, wherein the strong pages and the weak pages are alternately arranged on the basis of a predetermined order within each memory block.

5. The method according to claim 1, wherein the storage size of each first memory block is smaller than that of each second memory block.

6. The method according to claim 5, wherein each first memory block has half the storage size with respect to that of each second memory block.

7. The method according to claim 5, further comprising:
   storing the reorganized preloading data into the at least one second memory block and erasing the at least one first memory block, wherein each erased first memory block has the same storage size as each second memory block.

8. The method according to claim 1, further comprising:
   determining whether the preloading data stored in the at least one second memory block is correct.

9. The method according to claim 1, wherein the programming busy time of each strong page for storing data is less than that of each weak page.

10. The method according to claim 1, wherein the flash memory is a NAND flash memory.

11. The method according to claim 1, wherein each memory block is a multi-level cell memory block.

12. A memory device, comprising:
   a flash memory for storing data, wherein the flash memory comprises a plurality of memory blocks, each of which having a plurality of strong pages and a plurality of weak pages, and the strong pages have a higher data reliability than that of the weak pages; and
   a controller coupled to the flash memory for receiving a preloading data, storing the preloading data into the strong pages of at least one first memory block within the flash memory before the flash memory is heated in a solder reflow process,
   wherein the flash memory is heated for performing the solder reflow process and the controller reorganizes the preloading data according to a trigger signal and sequentially stores the reorganized preloading data into the strong pages and the weak pages of at least one second memory block within the flash memory.

13. The memory device according to claim 12, wherein the trigger signal is generated according to a recovery command from a host.

14. The memory device according to claim 12, wherein the trigger signal is generated according to a state of a preset pin of the flash memory.

15. The memory device according to claim 12, wherein the strong pages and the weak pages are alternately arranged on the basis of a predetermined order.

16. The memory device according to claim 12, wherein the storage size of each first memory block is smaller than that of each second memory block.

17. The memory device according to claim 16, wherein each first memory block has half the storage size with respect to that of each second memory block.

18. The memory device according to claim 16, wherein the reorganized preloading data is stored into the at least one second memory block, the controller erases the at least one first memory block, and each erased first memory block and each second memory block have the same storage size.

19. The memory device according to claim 12, wherein the controller determines whether the preloading data stored in the at least one second memory block is correct.

20. The memory device according to claim 12, wherein the programming busy time of each strong page for storing data is less than that of each weak page.

* * * * *